(12) United States Patent
Aoki

(10) Patent No.: US 7,312,684 B2
(45) Date of Patent: Dec. 25, 2007

(54) SEMICONDUCTOR DEVICE

(75) Inventor: Yutaka Aoki, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/639,747

(22) Filed: Dec. 15, 2006

(65) Prior Publication Data

US 2007/0139154 A1 Jun. 21, 2007

(30) Foreign Application Priority Data

Dec. 16, 2005 (JP) ............................. 2005-363122

(51) Int. Cl.
*H01F 5/00* (2006.01)
(52) U.S. Cl. ........................ 336/200; 336/223; 336/232
(58) Field of Classification Search ................. 336/200, 336/223, 232
See application file for complete search history.

(56) References Cited

U.S. PATENT DOCUMENTS

| | | | | |
|---|---|---|---|---|
| 4,816,784 | A | * | 3/1989 | Rabjohn ................... 333/24 R |
| 6,320,491 | B1 | | 11/2001 | Gevorgian et al. |
| 6,420,773 | B1 | * | 7/2002 | Liou .......................... 257/531 |
| 6,722,017 | B2 | * | 4/2004 | Rittner et al. .............. 29/602.1 |
| 6,825,749 | B1 | | 11/2004 | Lin et al. |
| 6,972,658 | B1 | | 12/2005 | Findley et al. |
| 2002/0130387 | A1 | | 9/2002 | Carpentier |
| 2003/0210122 | A1 | * | 11/2003 | Concord et al. ............ 336/200 |
| 2005/0151612 | A1 | | 7/2005 | Gau |

FOREIGN PATENT DOCUMENTS

| | | | |
|---|---|---|---|
| FR | 2 819 938 A1 | | 7/2002 |
| JP | 5609141406 A | * | 7/1981 |
| WO | WO 00/057437 A1 | | 9/2000 |

OTHER PUBLICATIONS

International Search Report and Written Opinion on the International Searching Authority, Dated Apr. 19, 2007, for PCT/JP2006/325670, 14 sheets.

* cited by examiner

*Primary Examiner*—Anh Mai
(74) *Attorney, Agent, or Firm*—Frishauf, Holtz, Goodman & Chick, P.C.

(57) ABSTRACT

A semiconductor device includes a semiconductor substrate, an insulating film formed on the semiconductor substrate, and a thin-film inductor element which is formed on the insulating film, and which includes first and second terminals and a conductive layer formed into a spiral shape between the first and second terminals so as to have a plurality of turns and at least one intersection. The conductive layer includes (i) a first conductor layer formed on the semiconductor substrate, and (ii) a second conductor layer which is formed on the insulating film, intersects the first conductor layer via the insulating film at the intersection. The thin-film inductor element has an arrangement in which the first and second conductor layers are symmetrically arranged in directions from an intermediate point between the first and second terminals along the longitudinal direction of the conductive layer to the first and second terminals.

24 Claims, 12 Drawing Sheets

SEMICONDUCTOR DEVICE

CROSS-REFERENCE TO RELATED APPLICATIONS

This application is based upon and claims the benefit of priority from prior Japanese Patent Application No. 2005-363122, filed Dec. 16, 2005, the entire contents of which are incorporated herein by reference.

BACKGROUND OF THE INVENTION

1. Field of the Invention

The present invention relates to a semiconductor device having a thin-film element formed on a semiconductor substrate via an insulating film and, more particularly, to a semiconductor device having a thin-film inductor element as the thin-film element.

2. Description of the Related Art

Recently, a semiconductor device having a so-called CSP (Chip Size Package) structure in which the sizes of a semiconductor chip and package are almost equal has been known, and has been used to increase the packaging density of a circuit board. A semiconductor device having this CSP structure has a plurality of posts for connecting to, e.g., an external circuit connected to connection pads of a semiconductor chip, and is connected to a circuit board by forming a solder ball on the upper surface of each post.

To form a semiconductor chip having, e.g., a radio-frequency wireless communicating function, it is necessary to form, in the semiconductor chip, various passive elements such as capacitor elements and inductor elements for implementing the RF function of a PLL circuit, VCO circuit, or filter circuit. Since these passive elements require a relatively large area, the chip area inevitably increases if these passive elements are incorporated into the semiconductor chip. Therefore, it is sometimes necessary to form these passive elements by forming thin-film elements on an insulting film on a semiconductor substrate having an integrated circuit, and connecting the passive elements to the integrated circuit, thereby suppressing the increase in chip area and increasing the packaging density.

When forming a thin-film inductor element as a thin-film element, the thin-film inductor element is formed by forming spiral conductive layers between the two terminals. If the two terminals of this thin-film inductor element are formed on the same plane and the number of turns of the spiral conductive layers is made larger than one in order to increase the inductance value of the thin-film inductor element, the conductive layers forming the thin-film inductor element necessarily intersect each other in a certain portion.

In this intersecting portion of the conductive layers, the two conductive layers intersect each other via the insulating film on the semiconductor substrate; one conductive layer is a lower conductive layer formed below the insulating film, and the other conductive layer is an upper conductive layer formed above the insulating film.

The lower conductive layer is closer to the substrate than the upper conductive layer. When a semiconductor substrate is used as the substrate, the inductor characteristic value (Q value) decreases under the influence of the substrate in the lower conductive layer close to the substrate. That is, when an electric current flows through the lower conductive layer, an eddy current also flows through the semiconductor substrate by induction because the electrical resistance of the substrate is relatively low. A loss produced by this eddy current causes a phenomenon in which the Q value of the thin-film inductor element decreases. The closer the lower conductive layer to the terminal of the inductor element, and the larger the length of the lower conductive layer, the larger the influence of the decrease in Q value.

Also, if the intersecting portion of the conductive layers is close to one of the two terminals of the thin-film inductor element, the Q value of the inductor viewed from this terminal becomes smaller than that viewed from the other terminal, and this makes the inductor characteristics viewed from the two terminals different from each other.

The inductor element is required to have high performance with a high Q value, and the inductor element is required to have characteristics which are symmetrical when viewed from the two terminals. That is, the inductor element is a two-terminal element and has no polarity. When using the inductor element as a circuit element, therefore, it is generally unnecessary to take account of a terminal to be connected to the circuit, so the characteristics viewed from the two terminals must be equal. However, the inductor characteristic values viewed from the two terminals are different in the thin-film inductor element having the arrangement as described above, and this makes the element very difficult to use as a circuit element.

BRIEF SUMMARY OF THE INVENTION

The present invention has the advantage of being able to provide a semiconductor device which has a thin-film element formed on a semiconductor substrate via an insulating film, and, when a thin-film inductor element is formed as the thin-film element, can substantially equalize the characteristic values viewed from the two terminals of the thin-film inductor element.

To obtain the above advantage, a first semiconductor device according to the present invention comprises a semiconductor substrate, an insulating film formed on the semiconductor substrate, and a thin-film inductor element which is formed on the insulating film and which includes a first terminal, a second terminal, and a conductive layer formed into a spiral shape between the first terminal and the second terminal so as to have a plurality of turns and at least one intersection. The conductive layer includes: (i) a first conductive layer formed on the semiconductor substrate, and (ii) a second conductive layer which is formed on the insulating film, connects to the first terminal and the second terminal, intersects the first conductive layer via the insulating film at the intersection, and is electrically connected to the first conductive layer near the intersection. The first conductive layer and the second conductive layer are symmetrically arranged in directions from an intermediate point between the first terminal and the second terminal along a longitudinal direction of the conductive layer to the first terminal and the second terminal, and a ratio of a length from the first terminal to a portion of the second conductive layer which electrically connects to the first conductive layer to a length from the second terminal to a portion which electrically connects to the first conductive layer is set at a value by which a difference between a Q value of the thin-film inductor element viewed from the first terminal and a Q value of the thin-film inductor element viewed from the second terminal is 10% or less.

The semiconductor substrate has a circuit element formation region in which an integrated circuit is formed, the insulating film is formed on the circuit element formation region, and the first conductive layer is formed in the circuit element formation region. A plurality of connecting terminals for external connection are formed on the semiconductor substrate, and each of the first terminal and the second terminal of the thin-film inductor element connects to one of the plurality of connecting terminals. The first conductive layer electrically connects to the second conductive layer through at least one hole formed in the insulating film near the intersection.

The first conductive layer is formed in a position including the intermediate point. In this case, as an example, the thin-film inductor element has two turns, and comprises an outer conductive layer made of the second conductive layer and formed into a partially cut annular shape, and an inner conductive layer made of the second conductive layer and formed inside the outer conductive layer into an annular shape that is cut on the same side that the outer conductive layer is cut, an extraction conductive layer formed from one end portion of the outer conductive layer to the first terminal and an extraction conductive layer formed from one end portion of the inner conductive layer to the second terminal, and a connection conductive layer which is: (i) formed in a position including the intermediate point at the intersection, (ii) is made of the first conductive layer, and (iii) electrically connects to an end portion of the outer conductive layer and an end portion of the inner conductive layer below the insulating film. At the intersection, the inner conductive layer or the extraction conductive layer is formed above the connection conductive layer via the insulating film.

Also, the thin-film inductor element according to the present invention has, for example, two turns, and comprises a semicircular first outer conductive layer and a semicircular second outer conductive layer made of the second conductive layer, an inner conductive layer formed into a partially cut annular shape inside the first outer conductive layer and the second outer conductive layer, an extraction conductive layer formed from a first end portion of the first outer conductive layer and a first end portion of the second outer conductive layer to the first terminal and the second terminal, respectively, a first connection conductive layer which: (i) is formed at the intersection, (ii) is made of the first conductive layer, and (iii) is electrically connected to a first end portion of the inner conductive layer and a second end portion of the first outer conductive layer below the insulating film, and a second connection conductive layer which is made of the first conductive layer, and which is electrically connected to a second end portion of the inner conductive layer and a second end portion of the second outer conductive layer below the insulating film. At the intersection, the second outer conductive layer is formed above the first connection conductive layer via the insulating film.

To obtain the above advantage, a second semiconductor device according to the present invention comprises a semiconductor substrate, an insulating film formed on the semiconductor substrate, and a thin-film inductor element which is formed on the insulating film, and which includes a first terminal, a second terminal, and a conductive layer formed into a spiral shape between the first terminal and the second terminal so as to have a plurality of turns and a plurality of intersections. The conductive layer includes: (i) a first conductive layer formed on the semiconductor substrate, and (ii) a second conductive layer which is formed on the insulating film, connects to the first terminal and the second terminal, intersects the first conductive layer via the insulating film at each of the intersections, and is electrically connected to the first conductive layer near each intersection. Two consecutive intersections along a longitudinal direction of the thin-film inductor element from the first terminal and two consecutive intersections from the second terminal of the conductive layer include a first intersection at which the conductive layer is made of the first conductive layer and a second intersection at which the conductive layer is made of the second conductive layer.

The conductive layer has equal numbers of intersections in a portion from an intermediate point between the first terminal and the second terminal along a longitudinal direction of the conductive layer to the first terminal, and in a portion from the intermediate point to the second terminal along the longitudinal direction of the conductive layer to the second terminal. An arrangement order of the first conductive layer and the second conductive layer forming the conductive layer at each of the plurality of intersections in a portion from an intermediate point between the first terminal and the second terminal along a longitudinal direction of the conductive layer to the first terminal is opposite to an arrangement order of the first conductive layer and the second conductive layer forming the conductive layer at each of the plurality of intersections in a portion along the longitudinal direction from the intermediate point to the second terminal. Also, an arrangement order of the first conductive layer and the second conductive layer in a portion from an intermediate point between the first terminal and the second terminal along a longitudinal direction of the conductive layer to the first terminal is the same as an arrangement order of the first conductive layer and the second conductive layer in a portion along the longitudinal direction from the intermediate point to the second terminal.

As an example, the thin-film inductor element according to the present invention has three turns and two intersections, and the first conductive layer and the second conductive layer forming the conductive layer are alternately formed at each of the two intersections in a portion from an intermediate point between the first terminal and the second terminal along a longitudinal direction of the conductive layer to the first terminal, and at each of the two intersections in a portion from the intermediate point to the second terminal along the longitudinal direction.

As another example, the thin-film inductor element according to the present invention has four turns and three intersections, and the first conductive layer and the second conductive layer forming the conductive layer are alternately formed at each of the three intersections in a portion from an intermediate point between the first terminal and the second terminal along a longitudinal direction of the conductive layer to the first terminal, and at each of the three intersections in a portion from the intermediate point to the second terminal along the longitudinal direction.

As still another example, the thin-film inductor element according to the present invention has four turns and three intersections, the first conductive layer forming the conductive layer is continuously formed at two consecutive intersections of the three intersections in a portion from an intermediate point between the first terminal and the second terminal along a longitudinal direction of the conductive layer to the first terminal, and the second conductive layer forming the conductive layer is continuously formed at two consecutive intersections of the three intersections in a portion from the intermediate point to the second terminal along the longitudinal direction.

DETAILED DESCRIPTION OF THE INVENTION

A semiconductor device and a method of fabricating the same according to various aspects of the present invention will be explained in detail below on the basis of embodiments shown in the accompanying drawings.

First Embodiment

Figure 1:
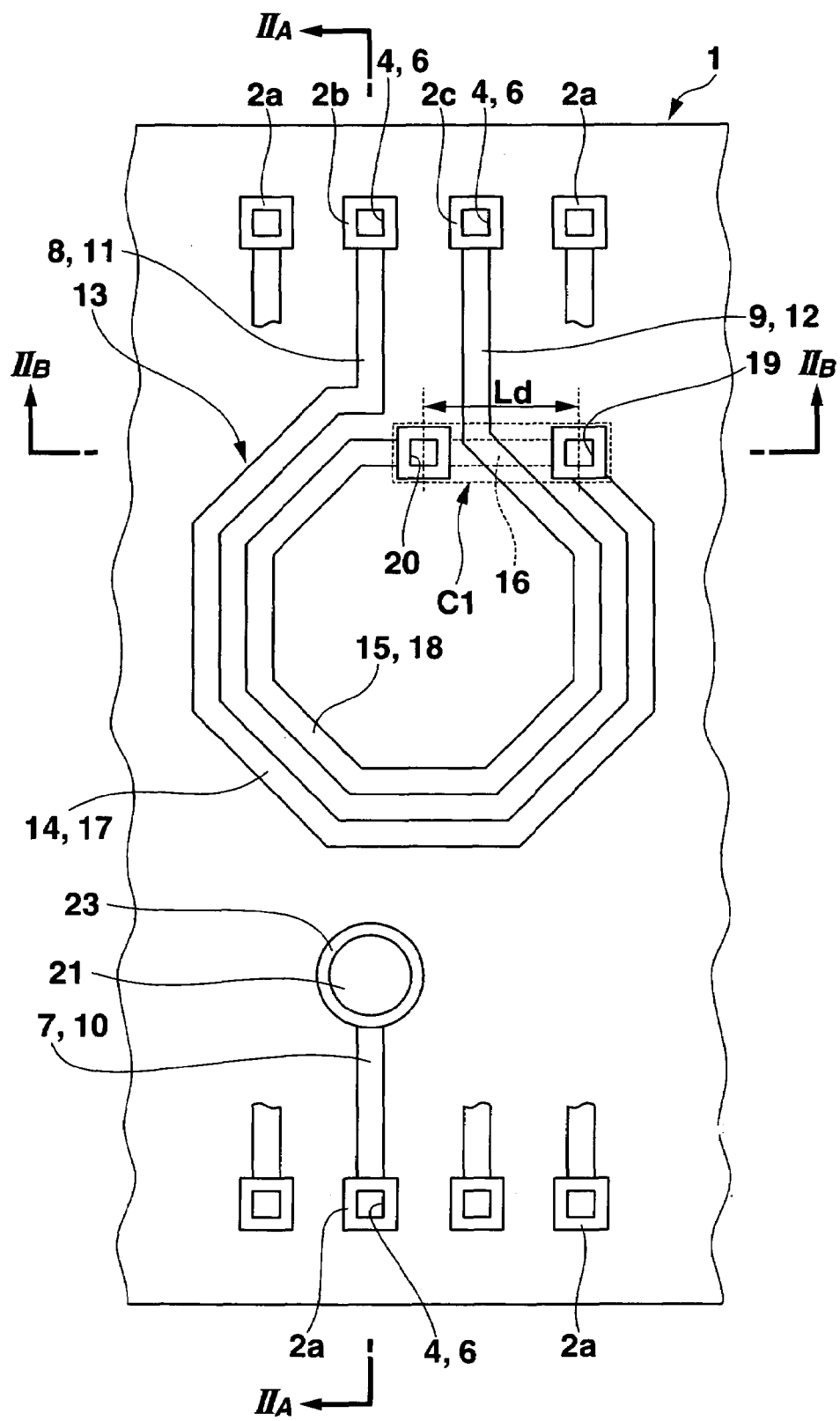
FIG. 1 is a plan view of the major components of a semiconductor device according to the first embodiment of the present invention.

FIG. 1 is a plan view of the major components of a semiconductor device according to the first embodiment of the present invention.

Figure 2A:
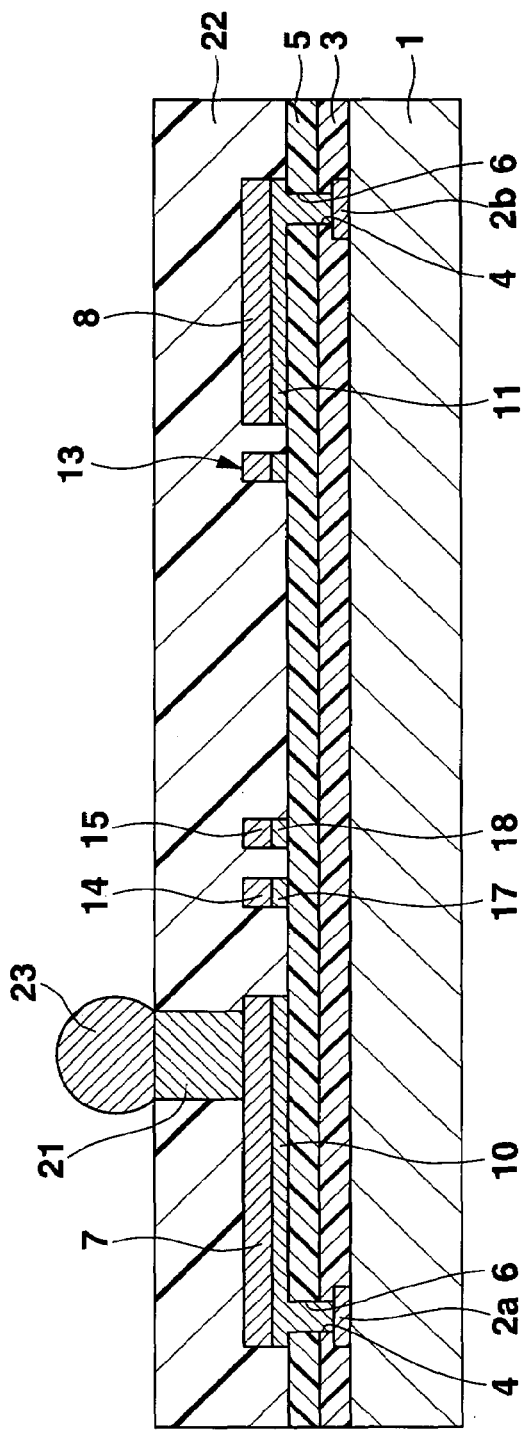
FIG. 2A is a sectional view taken along a line IIA-IIA in FIG. 1.
Figure 2B:
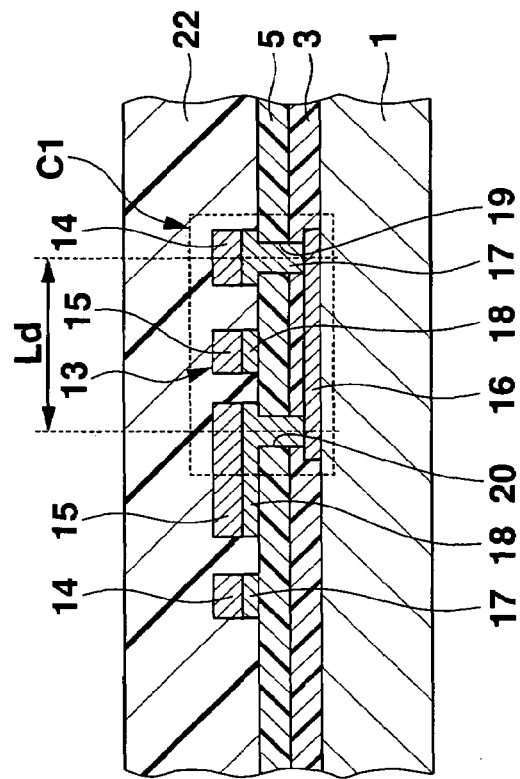
FIG. 2B is a sectional view taken along a line IIB-IIB in FIG. 1.

FIG. 2A is a sectional view taken along a line IIA-IIA in FIG. 1, and FIG. 2B is a sectional view taken along a line IIB-IIB in FIG. 1.

This semiconductor device is generally called a CSP (Chip Size Package), and has a silicon substrate (semiconductor substrate) 1.

As shown in FIGS. 1, 2A, and 2B, a circuit element formation region, in which an integrated circuit having a predetermined function is formed, is provided on the upper surface of the silicon substrate 1, and a plurality of external connection pads 2a, 2b, and 2c made of, e.g., an aluminum-based metal are formed in the peripheral portion of the upper surface of the silicon substrate 1 and are connected to the integrated circuit. Connection pads denoted by reference numerals 2b and 2c are connected to the two terminals (first and second terminals) of a thin-film inductor element 13 (to be described later), and arranged, e.g., adjacent to each other.

On the upper surface of the silicon substrate 1, a first conductive layer is formed to serve as a lower layer which forms a connection conductive layer of the thin-film inductor element 13. An insulating film 3 and protective film 5 are provided on the silicon substrate 1. Although the insulating film 3 is referred to as an "insulating film" herein, the insulating film may be understood as an insulating layer, and is formed by coating. A second conductive layer is formed on the upper surfaces of the insulating film 3 and protective film 5, to serve as an upper layer which forms underlying metal layers, outer conductive layer(s), inner conductive layer (s), and extraction conductive layers of the thin-film inductor element 13. The second conductive layer has a dual-layer structure so as to form the underlying metal layers as well as the conductive layers provided on the underlying metal layers.

The insulating film 3 made of, e.g., silicon oxide is formed on the upper surface of the silicon substrate 1 except for central portions of the connection pads 2a, 2b, and 2c. The central portions of the connection pads 2a, 2b, and 2c are exposed through holes 4 formed in the insulating film 3. The protective film (insulating film) 5 made of, e.g., a polyimide-based resin is formed on the upper surface of the insulating film 3. Holes 6 are formed in the portions of the protective film 5 which correspond to the holes 4 in the insulating film 3.

First, second, and third underlying metal layers 10, 11, and 12, an outer underlying metal layer 17, and an inner underlying metal layer 18 made of, e.g., copper are formed on the upper surface of the protective film 5 from the second conductive layer.

A first interconnection 7, first extraction conductive layer 8, and second extraction conductive layer 9 made of, e.g., copper are formed on the entire upper surfaces of the first, second, and third underlying metal layers 10, 11, and 12, respectively, from the second conductive layer.

An outer conductive layer 14 and inner conductive layer 15 are respectively formed on the entire upper surfaces of the outer underlying metal layer 17 and inner underlying metal layer 18 from the second conductive layer.

The connection pad 2a connects to a first end portion of the first interconnection 7 via the first underlying metal layer 10 through the holes 4 and 6 in the insulating film 3 and protective film 5. A columnar electrode 21 made of, e.g., copper is formed on the upper surface of the second end portion of the first interconnection 7.

The thin-film inductor element 13 will be explained next. For convenience, in the following description it is assumed that the respective conductive layers include the corresponding underlying metal layers on which the conductive layers are provided. For example, in the following description it is assumed that the first extraction conductive layer 8, second extraction conductive layer 9, outer conductive layer 14, and inner conductive layer 15 respectively include the second underlying metal layer 11, third underlying metal layer 12, outer underlying metal layer 17, and inner underlying metal layer 18.

The thin-film inductor element 13 of this embodiment has two spiral conductive layers and one three-dimensional intersection C1. The inductor element 13 includes the outer conductive layer 14, which is made of the second conductive layer, the inner conductive layer 15, which is made of the second conductive layer, the first extraction conductive layer 8 and second extraction conductive layer 9 made of the second conductive layer, and a linear connection conductive layer 16 which is made of the first conductive layer. The outer conductive layer 14 is formed on the protective film 5 and has an annular shape (e.g., a regular octagon in this embodiment) with a portion of the annular shape cut away/not present (i.e., a partially cut annular shape, see FIG. 1). The inner conductive layer 15 is formed on the protective film 5 inside the outer conductive layer 14 and has an annular shape (e.g. a regular octagon) with a portion cut away/not present at the same side as the outer conductive layer 14. The first extraction conductive layer 8 and the second extraction conductive layer 9 are respectively formed to extend from a first end portion of the outer conductive layer 14 and a first end portion of the inner conductive layer 15 to the connection pads 2b and 2c. The linear connection conductive layer 16 is formed on a portion of the upper surface of the silicon substrate 1 which corresponds to a second end portion of the outer conductive layer 14 and a second end portion of the inner conductive layer 15, so as to be coupled to the second end portions of the outer conductive layer 14 and the inner conductive layer 15. That is, the first extraction conductive layer 8, outer conductive layer 14, connection conductive layer 16, inner conductive layer 15, and second extraction conductive layer 9 are electrically connected to each other, and the outer conductive layer 14, connection conductive layer 16, and inner conductive layer 15 form the two spiral conductive layers having the intersection C1, thereby constructing the inductor. In the intersection C1, as shown in FIGS. 1 and 2B, the connection conductive layer 16 made of the first conductive layer and a portion of the inner conductive layer 15 intersect each other via the insulating film 3 and protective film 5 (i.e. with the insulating film 3 and protective film 5 between the connection conductive layer 16 and the portion of the inner conductive layer 15).

In this case, the outer conductive layer 14, inner conductive layer 15, first extraction conductive layer 8, and second extraction conductive layer 9 are made of, e.g., copper, and are respectively formed on the entire upper surfaces of the outer underlying metal layer 17, inner underlying metal layer 18, second underlying metal layer 11, and third underlying metal layer 12 made of, e.g., copper and formed on the upper surface of the protective film 5. Also, the connection conductive layer 16 is made of, e.g., an aluminum-based metal, and is formed on the portion of the upper surface of the silicon substrate 1 which corresponds to the second end portion of the outer conductive layer 14 and the second end portion of the inner conductive layer 15. The connection conductive layer 16 can also be preformed in the integrated circuit formed on the upper surface of the silicon substrate 1.

The first end portion of the outer conductive layer 14 connects to a second end portion of the first extraction conductive layer 8, and the second end portion of the outer conductive layer 14 connects to a first end portion of the connection conductive layer 16 through a hole (through hole) 19 formed in the insulating film 3 and protective film 5. The first end portion of the inner conductive layer 15 connects to a second end portion of the second extraction conductive layer 9, and the second end portion of the inner conductive layer 15 connects to the second end portion of the connection conductive layer 16 through a hole 20 formed in the insulating film 3 and protective film 5. In addition, the first end portion of the inner conductive layer 15 is formed over the connection conductive layer 16 with the insulating film 3 and protective film 5 therebetween, thereby forming the intersection C1 at which the inner conductive layer 15 and connection conductive layer 16 intersect each other.

Furthermore, a first end portion of the first extraction conductive layer 8 connects to the connection pad 2b through the holes 4 and 6 in the insulating film 3 and protective film 5, and a first end portion of the second extraction conductive layer 9 connects to the connection pad 2c through the holes 4 and 6 in the insulating film 3 and protective film 5.

A sealing film 22 made of, for example, an epoxy-based resin is formed on upper surfaces of the protective film 5, the first interconnection 7, and the thin-film inductor element 13, such that the upper surface of the sealing film 22 is leveled with the upper surface of the columnar electrode 21 formed on the upper surface of the second end of the first interconnection 7. A solder ball 23, for example, is formed on the upper surface of the columnar electrode 21.

The connection conductive layer 16, which is made of the first conductive layer and forms a portion of the thin-film inductor element 13, is formed on the upper surface of the silicon substrate 1 and hence is affected by the silicon substrate 1. Thus, an eddy current generated in the silicon substrate 1 produces a loss, thereby deteriorating the characteristics of the connection conductive layer 16 (decreasing the Q value). However, the first extraction conductive layer 8, second extraction conductive layer 9, outer conductive layer 14, and inner conductive layer 15, which are made of the second conductive layer and form portions of the thin-film inductor element 13, are separated (in the direction of thickness) from the upper surface of the silicon substrate 1 by the total thickness of the insulating film 3 and protective film 5, and therefore these layers are not easily affected by the silicon substrate 1 and the characteristics thereof are hardly deteriorated.

In the thin-film inductor element 13, the connection conductive layer 16 is formed between the second end portion of the outer conductive layer 14 and the second end portion of the inner conductive layer 15. In this case, the total length of the first extraction conductive layer 8 and outer conductive layer 14 and the total length of the second extraction conductive layer 9 and inner conductive layer 15 are equal or almost equal, (i.e., the difference between them is small).

Accordingly, the distance from a first end portion (the first terminal: connection pad 2b) of the thin-film inductor element 13 to the connection conductive layer 16 is equal to or almost equal to the distance from a second end portion (the second terminal: connection pad 2c) of the thin-film inductor element 13 to the connection conductive layer 16 (i.e., the difference between the distances is small), and the connection conductive layer 16 is formed at a position including an intermediate point along the longitudinal direction of the conductive layers forming the thin-film inductor element 13, between the first end portion (the connection pad 2b) and the second end portion (the connection pad 2c) of the thin-film inductor element 13.

Figure 3:
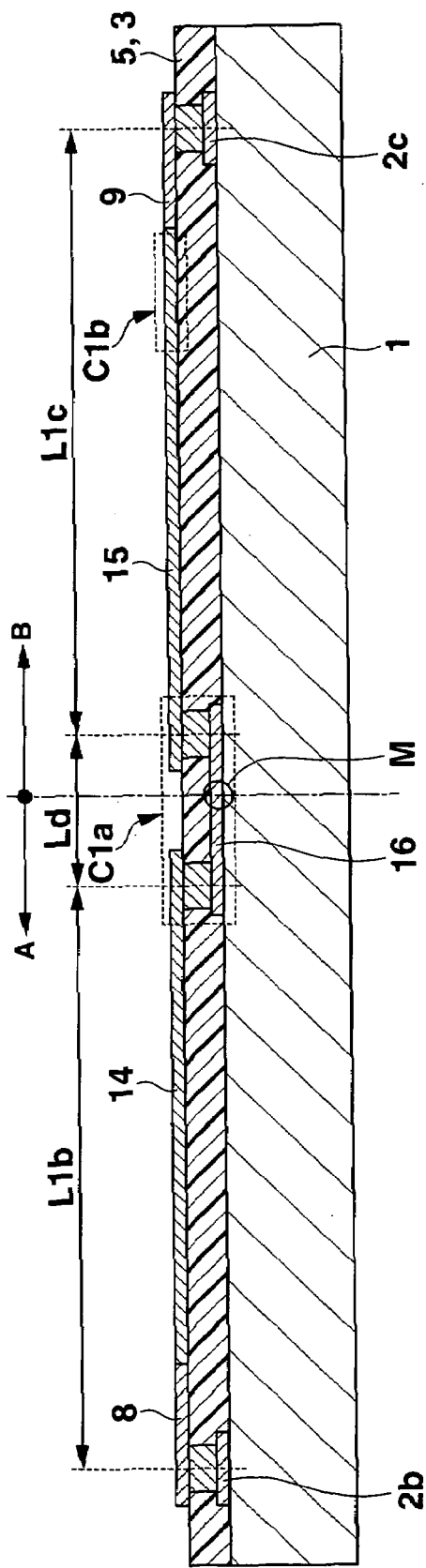
FIG. 3 is a schematic sectional view for explaining the concept of the arrangement of conductive layers in the first embodiment.

FIG. 3 is a schematic sectional view similar to FIG. 2 in which the conductive layers between the connection pads 2b and 2c (i.e., the inner and outer conductive layers 15 and 14, the first and second extraction conductive layers 8 and 9, and the connection conductive layer 16) are virtually linearly extended in order to explain the concept of the arrangement of the conductive layers in the first embodiment. Note that FIG. 3 is a view for explaining the arrangement concept and hence is partially simplified compared to the sectional views shown in FIGS. 2A and 2B.

In FIG. 3, reference symbol M denotes an intermediate point between the connection pads 2b and 2c along the longitudinal direction of the conductive layers; L1b denotes the distance from the first end portion (the connection pad 2b) of the conductive layers to the connection conductive layer 16 made of the first conductive layer; L1c denotes the distance from the second end portion (the connection pad 2c) of the conductive layers to the connection conductive layer 16 made of the first conductive layer; and Ld denotes the length of the connection conductive layer 16 made of the first conductive layer. In addition, reference symbols C1a and C1b in FIG. 3 denote portions corresponding to the intersection C1 shown in FIG. 1. Portions C1a and C1b actually exist in the same position and form the intersection C1 shown in FIG. 1 at which the connection conductive layer 16 and a portion of the inner conductive layer 15 intersect each other via the insulating film.

In the arrangement of the conductive layers according to this embodiment, in a direction A shown in FIG. 3 from the intermediate point M of the conductive layers to the first end portion (the connection pad 2b) of the conductive layers, the outer conductive layer 14 and first extraction conductive layer 8 (made of the second conductive layer) follow the connection conductive layer 16 (made of the first conductive layer). In a direction B shown in FIG. 3 from the intermediate point M of the conductive layers to the second end portion (the connection pad 2c) of the conductive layers, the inner conductive layer 15 and second extraction conductive layer 9 (made of the second conductive layer) follow the connection conductive layer 16 (made of the first conductive layer). Accordingly, in both direction A from the intermediate point to the first end portion of the conductive layers and direction B from the intermediate point to the second end portion of the conductive layers, the first and second conductive layers are formed in the same arrangement order. That is, starting at the intermediate point M and traveling along the conductive layers in direction A, first the first conductive layer is provided, and then the second conductive layer is provided. Similarly, starting at the intermediate point M and traveling along the conductive layers in direction B, first the first conductive layer is provided, and then the second conductive layer is provided.

The first extraction conductive layer 8, second extraction conductive layer 9, outer conductive layer 14, and inner conductive layer 15 made of the second conductive layer are formed on the protective film 5 and hence are not easily affected by the silicon substrate 1, so the Q value of the inductor in this portion has a favorable value. However, the connection conductive layer 16 as a lower layer made of the first conductive layer is formed on the silicon substrate 1, so the Q value of the inductor in this portion decreases under the influence of the silicon substrate 1. To increase the Q value, therefore, the distances L1b and L1c shown in FIG. 3) from the terminals to the lower conductive layer are preferably long. However, if the lower conductive layer is formed beyond the intermediate point of the conductive layers forming the inductor element from the terminal, the Q value of the inductor hardly depends upon the position of the lower conductive layer, as is known. On the other hand, to equalize the characteristics viewed from each of the two end portions of the inductor element, the distances from each of the two end portions to the lower conductive layer are preferably equal. In this first embodiment, therefore, the distances from each of the two end portions of the thin-film inductor element 13 to the connection conductive layer 16 made of the first conductive layer are equal or almost equal (Lb≈Lc), thereby forming the connection conductive layer 16 close to the intermediate point of the conductive layers between the two end portions. This makes it possible to equalize or almost equalize the characteristics viewed from the two terminals, and increase the Q value of the inductor element 13.

Note that in the above description, the conductive layer 16 is preformed in the integrated circuit on the upper surface of the silicon substrate 1, but the connection conductive layer 16 may also be formed on, e.g., the insulating film 3. In this case, the connection conductive layer 16 is spaced apart from the silicon substrate 1 by the film thickness of the insulating film 3, so it is possible to reduce the influence of the silicon substrate 1 on the connection conductive layer 16 and reduce the decrease in Q value in this portion, thereby increasing the Q value of the inductor element 13.

Second Embodiment

Figure 4:
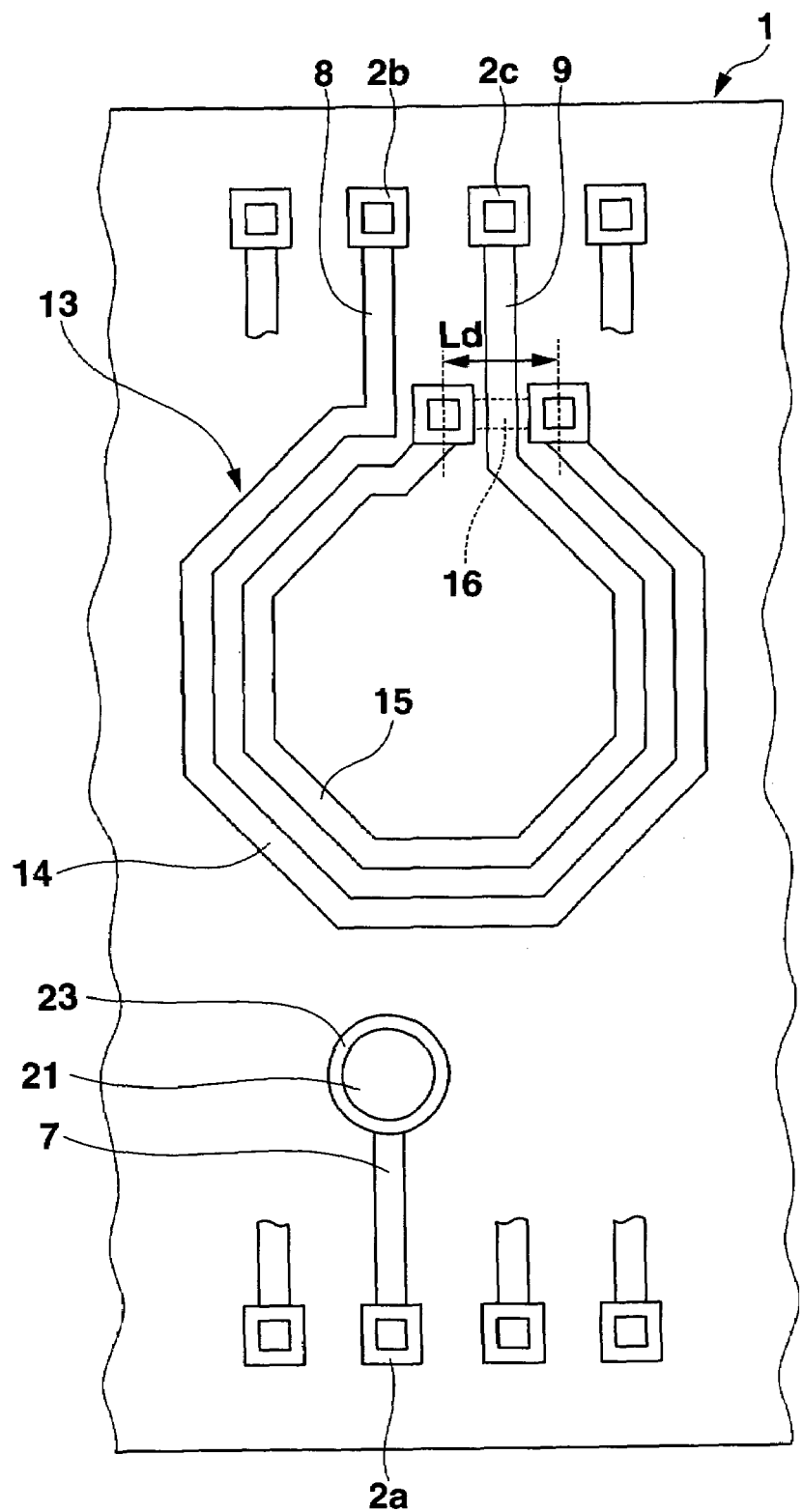
FIG. 4 is a plan view of the major components of a semiconductor device according to the second embodiment of the present invention.

FIG. 4 is a plan view of the major components of a semiconductor device according to the second embodiment of the present invention.

Like the semiconductor device according to the first embodiment described above, the semiconductor device according to the second embodiment includes an inductor formed by two spiral conductive layers and one intersection. The difference from the semiconductor device according to the first embodiment is that at the intersection, the connection conductive layer 16 intersects the second extraction conductive layer 9, which is formed over the connection conductive layer 16 via an insulating film 3 and protective film 5.

That is, in the first embodiment described above, as shown in FIG. 1, at the intersection C1 the connection conductive layer 16 intersects a portion of the annular inner conductive layer 15, and the inner conductive layer 15 obliquely intersects the connection conductive layer 16. By, contrast, according to the second embodiment, the connection conductive layer 16 and second extraction conductive layer 9 perpendicularly intersect each other. Therefore, the length (Ld) of the connection conductive layer 16 can be made smaller than according to the first embodiment. As described previously, the connection conductive layer 16, as a lower layer made of the first conductive layer reduces the Q value of the inductor under the influence of the silicon substrate 1, thereby deteriorating the characteristics. Since the second embodiment can decrease the length of the connection conductive layer 16 to a minimum necessary length, it is possible to reduce the characteristic deterioration caused by the connection conductive layer 16, and to increase the Q value of an inductor element 13.

Third Embodiment

Figure 5:
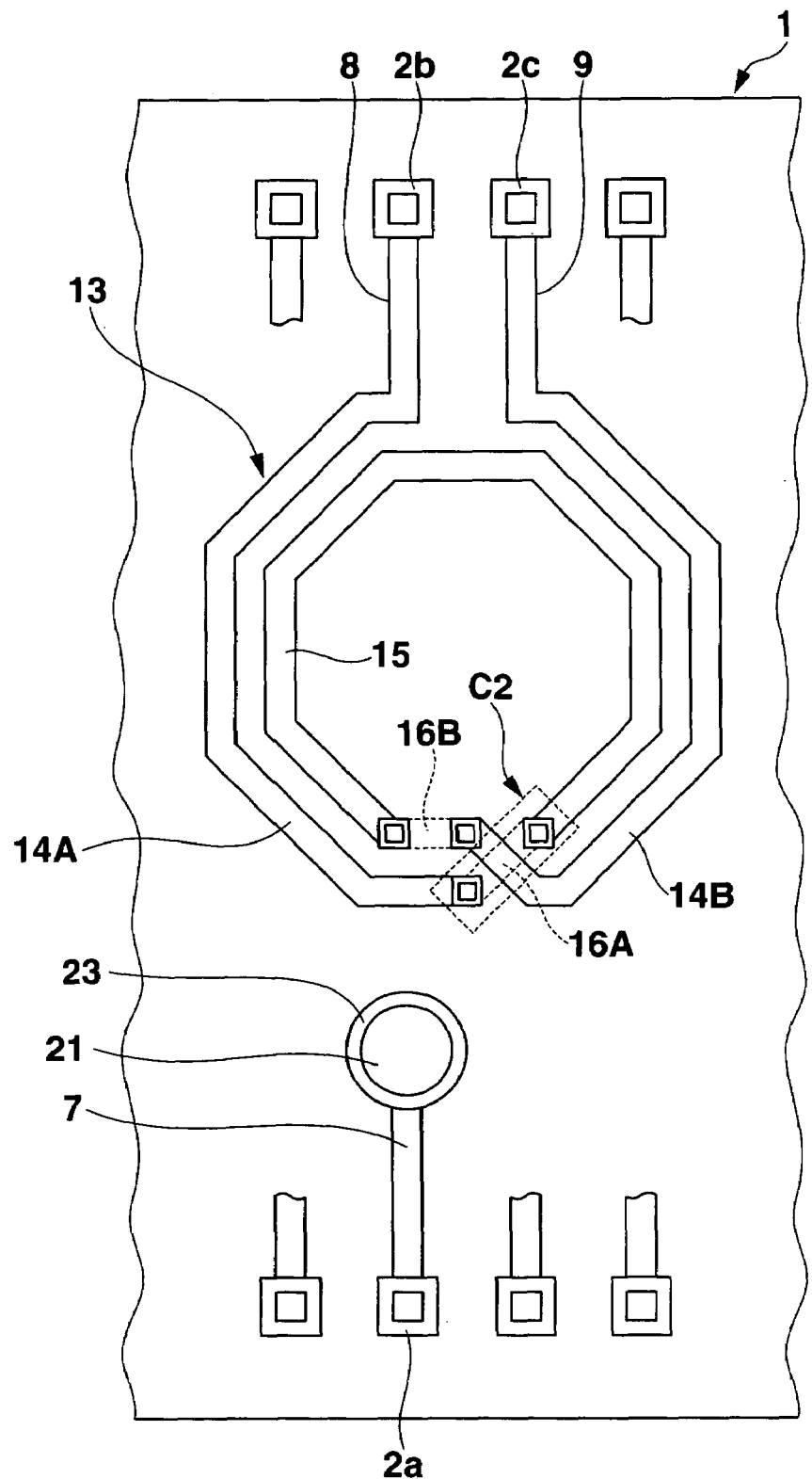
FIG. 5 is a plan view of the major components of a semiconductor device according to the third embodiment of the present invention.

FIG. 5 is a plan view of the major components of a semiconductor device according to the third embodiment of the present invention.

Like the semiconductor devices according to the first and second embodiments described above, the semiconductor device according to the third embodiment includes an inductor formed by two spiral conductive layers and one intersection. A significant difference of the semiconductor device according to the third embodiment as compared to the semiconductor devices according to the first and second embodiments is that two connection conductive layers are formed as lower layers.

A thin-film inductor element 13 according to the third embodiment includes semicircular (or, more specifically, semi-octagonal in the example shown in FIG. 5) first and second outer conductive layers 14A and 14B which oppose each other and are provided on the upper surface of a protective film 5, an inner conductive layer 15 which has an annular shape (e.g. octagonal) with a portion of the annular shape cut away/not present and which is positioned inside the first and second outer conductive layers 14A and 14B and on the upper surface of the protective film 5, first and second extraction conductive layers 8 and 9, and first and second connection conductive layers 16A and 16B formed in two predetermined portions on the upper surface of, e.g., a silicon substrate 1.

A first end portion of the first outer conductive layer 14A connects to the second end portion of the first extraction conductive layer 8, and a second end portion of the first outer conductive layer 14A connects to a first end portion of the first connection conductive layer 16A through holes formed in an insulating film 3 and the protective film 5.

A first end portion of the second outer conductive layer 14B connects to the second end portion of the second extraction conductive layer 9, and a second end portion of the second outer conductive layer 14B connects to a first end portion of the second connection conductive layer 16B through holes formed in the insulating film 3 and protective film 5.

A first end portion of the inner conductive layer 15 connects to a second end portion of the first connection conductive layer 16A through holes formed in the insulating film 3 and protective film 5, and a second end portion of the inner conductive layer 15 connects to a second end portion of the second connection conductive layer 16B through holes formed in the insulating film 3 and protective film 5.

The second end portion of the second outer conductive layer 14B is formed over the first connection conductive layer 16A via the insulating film 3 and protective film 5, thereby forming an intersection C2 at which the second outer conductive layer 14B and the first connection conductive layer 16A intersect each other. On the other hand, only the insulating film 3 and protective film 5 are formed on the second connection conductive layer 16B, and therefore no intersection is formed on the second connection conductive layer 16B.

In addition, the first end portion of the first extraction conductive layer 8 connects to the connection pad 2b, and the end portion of the second extraction conductive layer 9 connects to the connection pad 2c.

Figure 6:
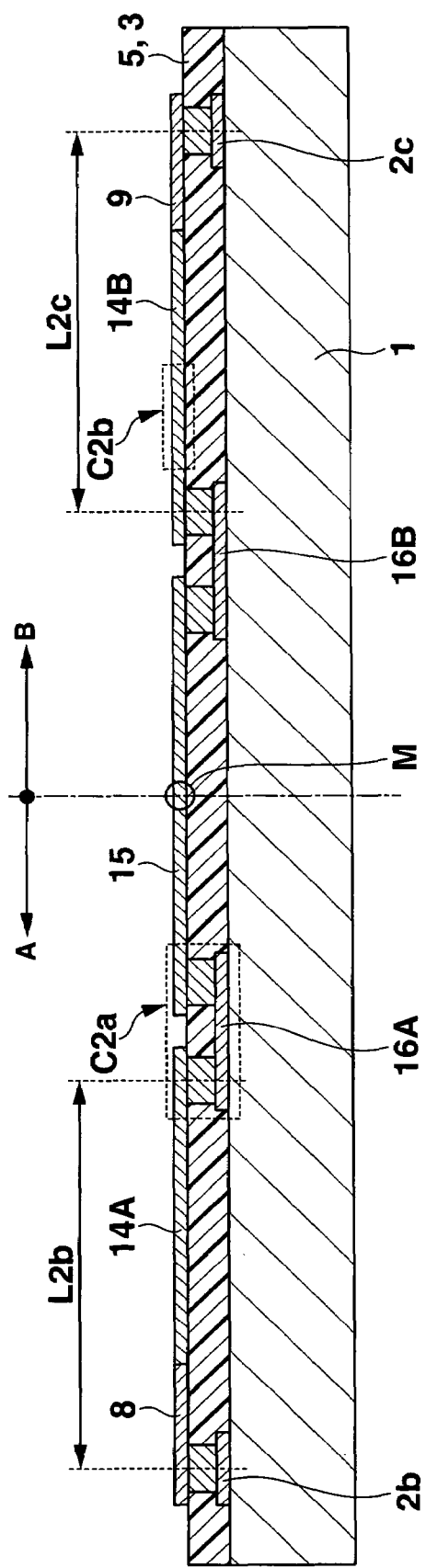
FIG. 6 is a schematic sectional view for explaining the concept of the arrangement of conductive layers in the third embodiment.

FIG. 6 is a schematic sectional view similar to FIG. 3 in which the conductive layers between the connection pads 2b and 2c are virtually linearly extended in order to explain the concept of the arrangement of the conductor and conductive layers in the third embodiment.

In FIG. 6, reference symbol M denotes an intermediate point between the connection pads 2b and 2c along the longitudinal direction of the conductive layers; L2b denotes the distance from the first end portion (the connection pad 2b) of the conductive layers to the first connection conductive layer 16A made of the first conductive layer; and L2c denotes the distance from the second end portion (the connection pad 2c) of the conductive layers to the second connection conductive layer 16B made of the first conductive layer. In addition, reference symbols C2a and C2b in FIG. 6 denote portions corresponding to the intersection C2 shown in FIG. 5. C2a and C2b actually exist in the same position and form the intersection C2 shown in FIG. 5 at which the first connection conductive layer 16A and the second end portion of the second outer conductive layer 14B intersect each other via the insulating film 3 and protective film 5.

In the arrangement of the conductive layers according to this embodiment, the distance (L2b shown in FIG. 6) from the first end portion (the first terminal: connection pad 2b) of the thin-film inductor element 13 to the first connection conductive layer 16A is equal to or almost equal to the distance (L2c shown in FIG. 6) from the second end portion (the second terminal: connection pad 2c) of the thin-film inductor element 13 to the second connection conductive layer 16B (i.e., the difference between the distances is small). Accordingly, the third embodiment can equalize or almost equalize the distances from the first and second end portions of the thin-film inductor element 13 to the first and second connection conductive layers 16A and 16B, respectively. This makes it possible to equalize or almost equalize the characteristics of the thin-film inductor element as viewed from each of the two end portions of the thin-film inductor element 13.

In FIG. 6, point M is an intermediate point M of the conductive layers between the first end portion (the connection pad 2b) and the second end portion (the connection pad 2c) of the thin-film inductor element 13. According to the third embodiment, in a direction A shown in FIG. 6 from the intermediate point M to the first end portion (connection pad 2b) of the conductive layers, the first connection conduction layer 16A (made of the first conductive layer) follows the inner conductive layer 15 (made of the second conductive layer), and the first outer conductive layer 14A and first extraction conductive layer 8 (made of the second conductive layer) follow the first connection conductive layer 16A (made of the first conductive layer). In a direction B shown in FIG. 6 from the intermediate point M to the second end portion (the connection pad 2c) of the conductive layers, the second connection conductive layer 16B (made of the first conductive layer) follows the inner conductive layer 15 (made of the second conductive layer), and the second outer conductive layer 14B and second extraction conductive layer 9 (made of the second conductive layer) follow the second connection conductive layer 16B (made of the first conductive layer). Accordingly, in both direction A from the intermediate point to first end portion of the conductive layers and direction B from the intermediate point to the second end portion of the conductive layers, the first and second conductive layers are formed in the same arrangement order.

Fourth Embodiment

Figure 7:
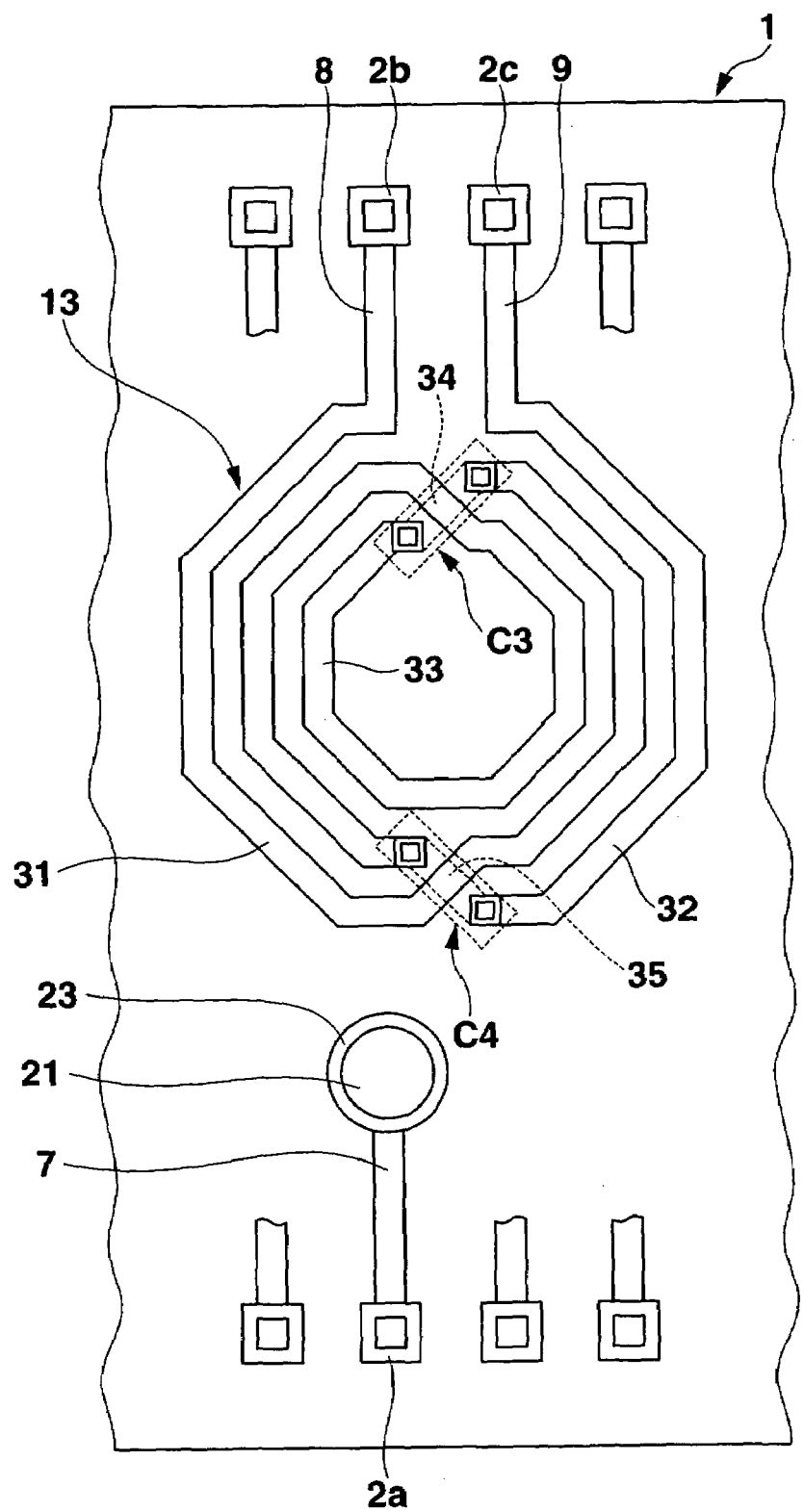
FIG. 7 is a plan view of the major components of a semiconductor device according to the fourth embodiment of the present invention.

FIG. 7 is a plan view of the major components of a semiconductor device according to the fourth embodiment of the present invention.

The semiconductor device according to the fourth embodiment includes an inductor formed by three spiral conductive layers and two intersections.

According to the fourth embodiment, the thin-film inductor element 13 includes a first outer conductive layer 31 which is formed on the upper surface of the protective film 5 and has an annular shape with a portion of the annular shape cut away/not present, a semicircular second outer conductive layer 32 which is formed on the upper surface of protective film 5 outside and to the right (as shown in FIG. 7) of the first outer conductive layer 31, a spiral inner conductive layer 33 having 1.5 turns which is formed on the upper surface of the protective film 5 and which is positioned inside the first outer conductive layer 31, the first and second extraction conductive layers 8 and 9, and first and second connection conductive layers 34 and 35 formed in two predetermined portions on the upper surface of, e.g., a silicon substrate 1.

A first end portion of the first outer conductive layer 31 connects to the second end portion of the first extraction conductive layer 8, and a second end portion of the first outer conductive layer 31 connects to a first end portion of the first connection conductive layer 34.

A first end portion of the second outer conductive layer 32 connects to the second end portion of the second extraction conductive layer 9, and a second end portion of the second outer conductive layer 32 connects to a first end portion of the second connection conductive layer 35.

A first end portion of the inner conductive layer 33 connects to a second end portion of the first connection conductive layer 34, and a second end portion of the inner conductive layer 33 connects to a second end portion of the second connection conductive layer 35.

A portion of the inner conductive layer 33 is formed over the first connection conductive layer 34 via the insulating film 3 and the protective film 5, thereby forming a first intersection C3 at which the inner conductive layer 33 and first connection conductive layer 34 intersect each other. Also, a portion of the first outer conductive layer 31 is formed over the second connection conductive layer 35 via the insulating film 3 and protective film 5, thereby forming a second intersection C4 at which the first outer conductive layer 31 and second connection conductive layer 35 intersect each other.

Furthermore, the first end portion of the first extraction conductive layer 8 connects to the connection pad 2b, and the second end portion of the second extraction conductive layer 9 connects to the connection pad 2c.

In this embodiment, the first and second connection conductive layers 34 and 35 are arranged on, e.g., a central line passing between the two end portions (the connection pads 2b and 2c) of the thin-film inductor element 13. That is, the two intersections of the spiral thin-film inductor element 13 having three turns are arranged on the central line passing between the two end portions of the thin-film inductor element 13, and the thin-film inductor element 13 has a structure that is almost symmetrical about the central line.

Figure 8:
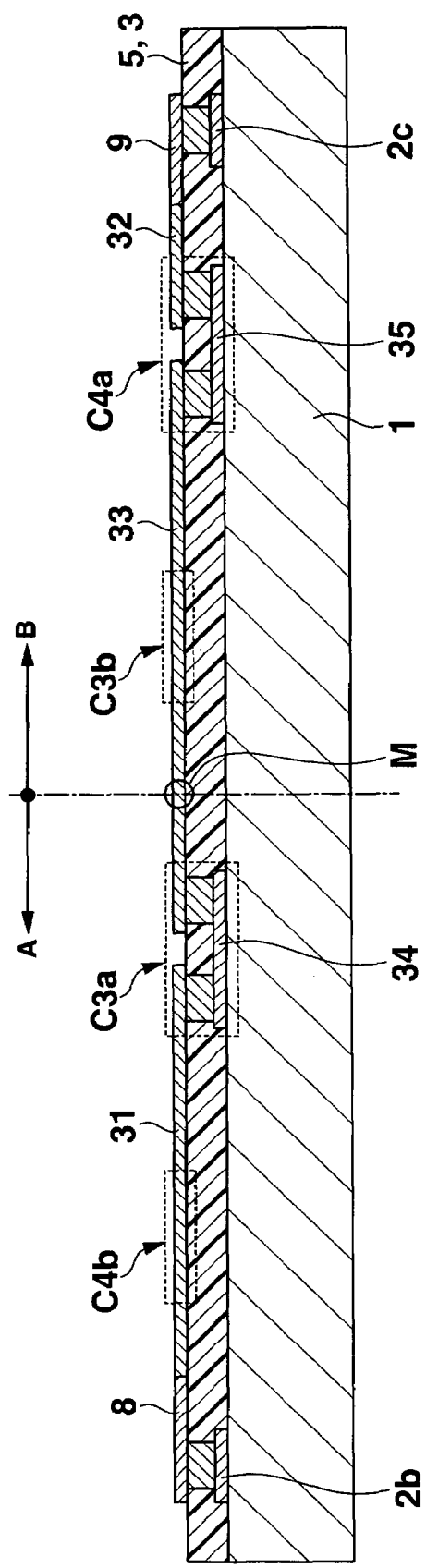
FIG. 8 is a schematic sectional view for explaining the concept of the arrangement of conductive layers in the fourth embodiment.

FIG. 8 is a schematic sectional view similar to FIG. 3 in which the conductive layers between the connection pads 2b and 2c are virtually linearly extended in order to explain the concept of the arrangement of the conductive and conductive layers in the fourth embodiment.

Reference symbol M in FIG. 8 denotes an intermediate point between the connection pads 2b and 2c along the longitudinal direction of the conductive layers. Reference symbols C3a and C3b in FIG. 8 denote portions corresponding to the first intersection C3 shown in FIG. 7. Portions C3a and C3b actually exist in the same position, and form the first intersection C3 shown in FIG. 7 at which the first connection conductive layer 34 and a portion of the inner conductive layer 33 intersect each other via the insulating film 3 and protective film 5. Reference symbols C4a and C4b in FIG. 8 denote portions corresponding to the second intersection C4 shown in FIG. 7. Portions C4a and C4b actually exist in the same position, and form the second intersection C4 shown in FIG. 7 at which the second connection conductive layer 35 and a portion of the first outer conductive layer 31 intersect each other via the insulating film 3 and the protective film 5.

With the arrangement of the conductive layers according to this embodiment, a portion of each of the two intersections C3 and C4 is positioned between the intermediate point M and the first end portion (the connection pad 2b) of the conductive layers, and a portion of each of the two intersections C3 and C4 is positioned between the intermediate point M and the second end portion (the connection pad 2c) of the conductive layers.

With this structure, the first connection conductive layer 34 (made of the first conductive layer), which is provided at the first intersection C3, and the first outer conductive layer 31 (made of the second conductive layer) including the portion thereof which is provided at the second intersection C4, are provided along direction A shown in FIG. 8, which extends from the intermediate point M to the first end portion (the connection pad 2b) of the conductive layers. That is, both the first and second conductive layers are present along direction A in FIG. 8. In addition, the inner conductive layer 33 (made of the second conductive layer), including the portion thereof provided at the first intersection C3, and the second connection conductive layer 35 (made of the first conductive layer) which is provided at the second intersection C4 are provided along direction B shown in FIG. 8, which extends from the intermediate point M to the second end portion (the connection pad 2c) of the conductive layers. That is, both the first and second conductive layers are present along direction B in FIG. 8.

Thus, the first connection conductive layer 34 (made of the first conductive layer) and the first outer conductive layer 31 (made of the second conductive layer) are arranged in this order at the first and second intersections C3 and C4 along direction A in the portion of the conductive layers extending from the intermediate point M to the first end portion of the conductive layers. In addition, the inner conductive layer 33 (made of the second conductive layer), the second connection conductive layer 35 (made of the first conductive layer) are arranged in this order at the first and second intersections C3 and C4 along direction B in the portion of the conductive layers extending from the intermediate point M to the second end portion of the conductive layers. Accordingly, the arrangement order of the first and second conductive layers at each intersection along direction A is opposite to the arrangement order of the first and second conductive layers at each intersection along direction B, and vice versa.

Also, in direction A shown in FIG. 8 from the intermediate point M to the first end portion of the conductive layers of the thin-film inductor element 13, the first connection conductive layer 34 (made of the first conductive layer) follows the inner conductive layer 33 (made of the second conductive layer), and the first outer conductive layer 31 and first extraction conductive layer 8 (made of the second conductive layer) follow the first connection conductive layer 34 (made of the first conductive layer). In direction B shown in FIG. 8 from the intermediate point M to the second end portion of the conductive layers, the second connection conductive layer 35 (made of the first conductive layer) follows the inner conductive layer 33 (made of the second conductive layer), and the second outer conductive layer 32 and second extraction conductive layer 9 (made of the second conductive layer) follow the second connection conductive layer 35 (made of the first conductive layer). Accordingly, in both direction A from the intermediate point to the first end portion of the conductive layers and direction B from the intermediate point to the second end portion of the conductive layers, the first and second conductive layers are arranged in the same order.

As described above, the semiconductor device according to the fourth embodiment has a plurality of portions of conductive layers that form intersections provided between the intermediate point M and each of the two end portions of the conductive layers of the thin-film inductor element 13, such that an equal number of the portions of the conductive layers that form the intersections are provided along direction A (from the intermediate point M to the first end portion) and along direction B (from the intermediate point M to the second end portion). In addition, both the first and second conductive layers are provided along direction A (from the intermediate point M to the first end portion) and along direction B (from the intermediate point M to the second end portion). Accordingly, it is possible to equalize or almost equalize the decreases in Q value caused by the first conductive layer as a lower layer with respect to the inductor characteristics viewed from each of the two end portions, and equalize or almost equalize the characteristics viewed from each of the two end portions of the thin-film inductor element 13.

Note that in the above description, the first and second connection conductive layers 34 and 35 are arranged on the central line, the inductor element 13 has a structure that is almost symmetrical about the central line, and each of the portions from the intermediate point to one of the end portions of the conductive layers has portions that are provided at each of the two intersections. However, the above embodiment is merely an example. That is, according to the fourth embodiment the first and second connection conductive layers 34 can be either symmetrical or asymmetrical about the central line, and the inductor element 13 can have a structure that is asymmetrical about the central line, provided that the semiconductor device has a plurality of intersections and both the first and second conductive layers are provided in each of the portions from the intermediate point to one of the two end portions of the conductive layers of the thin-film inductor element 13.

Fifth Embodiment

Figure 9:
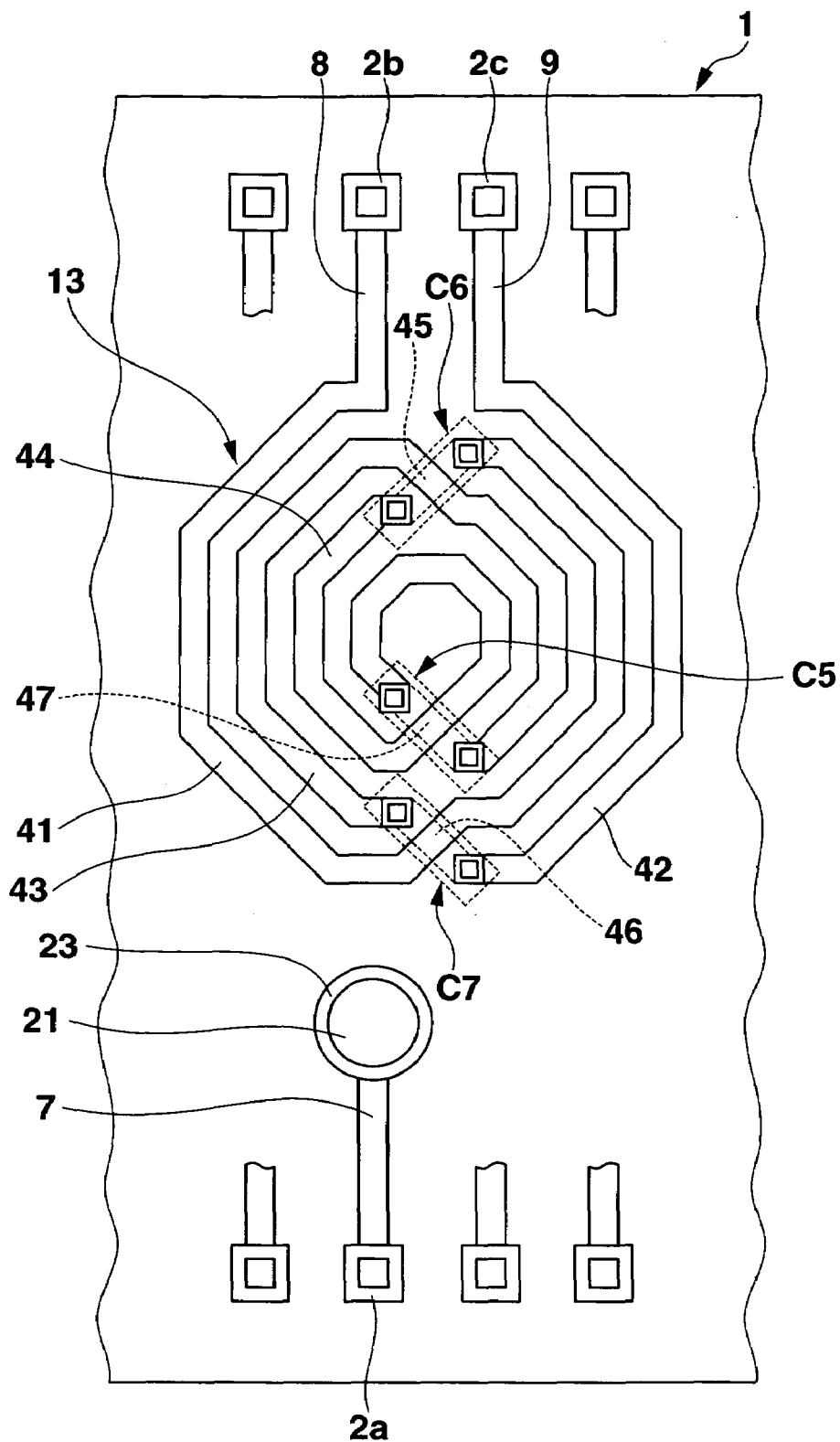
FIG. 9 is a plan view of the major components of a semiconductor device according to the fifth embodiment of the present invention.

FIG. 9 is a plan view of the major components of a semiconductor device according to the fifth embodiment of the present invention.

The semiconductor device according to the fifth embodiment includes an inductor formed by four spiral conductive layers and three intersections.

According to the fifth embodiment, the thin-film inductor element 13 includes: (i) a first outer conductive layer 41 which is formed on the upper surface of the protective film 5 and has an annular shape with a portion of the annular shape cut away/not present, (ii) a semicircular second outer conductive layer 42 which is formed on the upper surface of the protective film 5 outside and to the right (as shown in FIG. 9) of the first outer conductive layer 41, (iii) a first inner conductive layer 43 which is formed on the upper surface of the protective film 5 and has an annular shape with a portion of the annular shape cut away/not present, and which is positioned inside the first outer conductive layer 41, (iv) a spiral second conductive layer 44 having 1.5 turns which is formed on the upper surface of the protective film 5 and which is positioned inside the first inner conductive layer 43, (v) the first and second extraction conductive layers 8 and 9, and (vi) first, second, and third connection conductive layers 45, 46, and 47 formed in three predetermined portions on the upper surface of, e.g., a silicon substrate 1.

A first end portion of the first outer conductive layer 41 connects to the second end portion of the first extraction conductive layer 8, and a second end portion of the first outer conductive layer 41 connects to a first end portion of the first connection conductive layer 45.

A first end portion of the second outer conductive layer 42 connects to the second end portion of the second extraction conductive layer 9, and a second end portion of the second outer conductive layer 42 connects to a first end portion of the second connection conductive layer 46.

A first end portion of the first inner conductive layer 43 connects to a second end portion of the second connection conductive layer 46, and a second end portion of the first inner conductive layer 43 connects to a first end portion of the third connection conductive layer 47.

A first end portion of the second inner conductive layer 44 connects to a second end portion of the first connection conductive layer 45, and a second end portion of the second inner conductive layer 44 connects to a second end portion of the third connection conductive layer 47.

A portion of the second inner conductive layer 44 is formed over the third connection conductive layer 47 via the insulating film 3 and the protective film 5, thereby forming a first intersection C5 at which the second inner conductive layer 44 and third connection conductive layer 47 intersect each other. A portion of the first inner conductive layer 43 is formed over the first connection conductive layer 45 via the insulating film 3 and protective film 5, thereby forming a second intersection C6 at which the first inner conductive layer 43 and first connection conductive layer 45 intersect each other. And a portion of the first outer conductive layer 41 is formed over the second connection conductive layer 46 via the insulating film 3 and protective film 5, thereby forming a third intersection C7 at which the first outer conductive layer 41 and second connection conductive layer 46 intersect each other.

Furthermore, the first end portion of the first extraction conductive layer 8 connects to the connection pad 2*b*, and the second end portion of the second extraction conductive layer 9 connects to the connection pad 2*c*.

In this embodiment, the first, second, and third connection conductive layers 45, 46, and 47 are arranged on, e.g., a central line passing between the two end portions (the connection pads 2*b* and 2*c*) of the thin-film inductor element 13. That is, the three intersections of the spiral thin-film inductor element 13 having four turns are arranged on the central line passing between the two end portions of the thin-film inductor element 13, and the thin-film inductor element 13 has a structure that is almost symmetrical about the central line.

Figure 10:
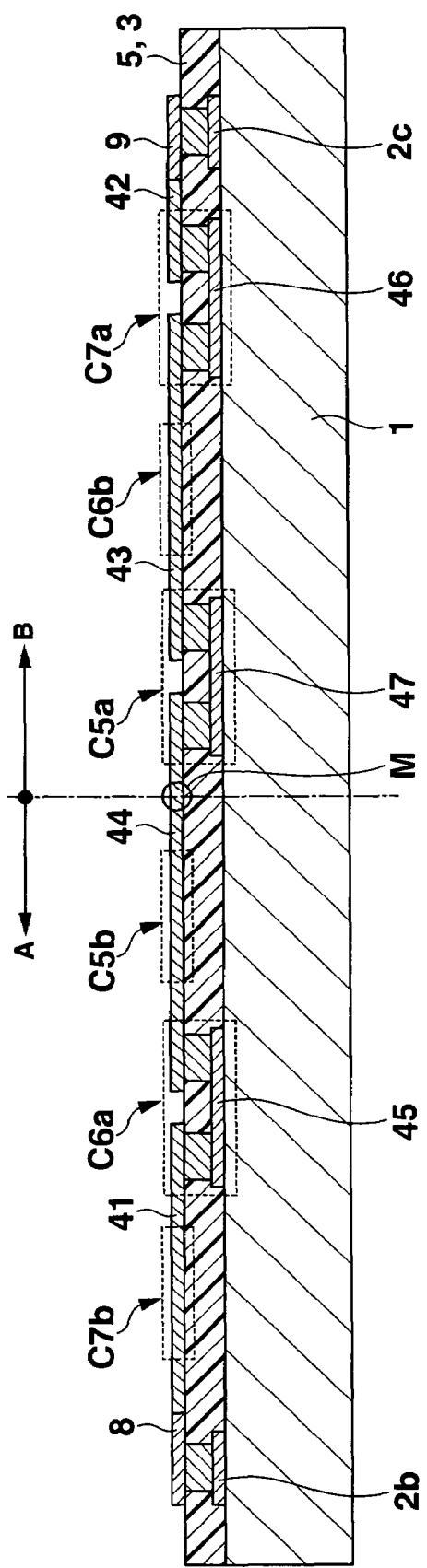
FIG. 10 is a schematic sectional view for explaining the concept of the arrangement of conductive layers in the fifth embodiment.

FIG. 10 is a schematic sectional view similar to FIG. 3 in which the conductive layers between the connection pads 2*b* and 2*c* are virtually linearly extended in order to explain the concept of the arrangement of the conductor and conductive layers in the fifth embodiment.

Reference symbol M in FIG. 10 denotes an intermediate point between the connection pads 2*b* and 2*c* along the longitudinal direction of the conductive layers. Reference symbols C5*a* and C5*b* in FIG. 10 denote portions corresponding to the first intersection C5 shown in FIG. 9. Portions C5*a* and C5*b* actually exist in the same position, and form the first intersection C5 shown in FIG. 9 at which the third connection conductive layer 47 and a portion of the second inner conductive layer 44 intersect each other via the insulating film 3 and the protective film 5. In addition, reference symbols C6*a* and C6*b* in FIG. 10 denote portions corresponding to the second intersection C6 shown in FIG. 9. Portions C6*a* and C6*b* actually exist in the same position, and form the second intersection C6 shown in FIG. 9 at which the first connection conductive layer 45 and a portion of the first inner conductive layer 43 intersect each other via the insulating film 3 and the protective film 5. Still further, reference symbols C7*a* and C7*b* in FIG. 10 denote portions corresponding to the third intersection C7 shown in FIG. 9. Portions C7*a* and C7*b* actually exist in the same position, and form the third intersection C7 shown in FIG. 9 at which the second connection conductive layer 46 and a portion of the first outer conductive layer 41 intersect each other via the insulating film 3 and protective film 5.

With the arrangement of the conductive layers according to this embodiment, a portion of each of the three intersections C5, C6, C7 is positioned between the intermediate point M and the first end portion (the connection pad 2*b*) of the conductive layers, and a portion of each of the three intersections C5, C6 and C7 is positioned between the intermediate point M and the second end portion (the connection pad 2*c*) of the conductive layers.

With this structure, the second inner conductive layer 44 (made of the second conductive layer) including the portion thereof which is provided at the first intersection C5, the first connection conductive layer 45 (made of the first conductive layer), which is provided at the second intersection C6, and the first outer conductive layer 41 (made of the second conductive layer), including the portion thereof which is provided at the third intersection C7 are provided along direction A shown in FIG. 10, which extends from the intermediate point M to the first end portion (the connection pad 2*b*) of the conductive layers. That is, both the first and second conductive layers are present along direction A in FIG. 10. In addition, the third connection conductive layer 47 (made of the first conductive layer), which is provided at the first intersection C5, the first inner conductive layer 43 (made of the second conductive layer), including the portion thereof which is provided at the second intersection C6, and the second connection conductive layer 46 (made of the first conductive layer), which is provided at the third intersection C7 are provided along direction B shown in FIG. 10, which extends from the intermediate point M to the second end portion (the connection pad 2*c*) of the conductive layers. That is, both the first and second conductive layers are present along direction B in FIG. 10.

Thus, the second inner conductive layer 44 (made of the second conductive layer), the first connection conductive layer 45 (made of the first conductive layer), and the first outer conductive layer 41 (made of the second conductive layer) are arranged in this order at the first, second, and third intersections C5, C6, and C7 along direction A in the portion of the conductive layers extending from the intermediate point M to the first end portion of the conductive layers. In addition, the third connection conductive layer 47 (made of the first conductive layer), the first inner conductive layer 43 (made of the second conductive layer), and the second connection conductive layer 46 (made of the first conductive layer) are arranged in this order at the first, second, and third intersections C5, C6, and C7 along direction B in the portion of the conductive layers extending from the intermediate point M to the second end portion of the conductive layers. Accordingly, the arrangement order of the first and second conductive layers at each intersection along direction A is opposite to the arrangement order of the first and second conductive layers at each intersection along direction B, and vice versa.

As described above, the semiconductor device according to the fifth embodiment has a plurality of portions of conductive layers that form intersections provided between the intermediate point M and each of the two end portions of the conductive layers of the thin-film element 13, such that an equal number of the portions of the conductive layers that form the intersections are provided along direction A (from the intermediate point M to the first end portion) and along direction B (from the intermediate point M to the second end portion). In addition, both the first and second conductive layers are provided along direction A (from the intermediate point M to the first end portion) and along direction B (from the intermediate point M to the second end portion). Accordingly, it is possible to equalize or almost equalize the decreases in Q value caused by the first conductive layer as a lower layer with respect to the inductor characteristics viewed from each of the two end portions, and equalize or almost equalize the characteristics viewed from each of the two end portions of the thin-film inductor element 13.

Note that in the above description, the first, second, and third connection conductive layers 45, 46, and 47 are arranged on the central line, the inductor element 13 has a structure that is almost symmetrical about the central line, and each of the portions from the intermediate point to one of the end portions of the conductive layers has portions that are provided at each of the three intersections. However, the above embodiment is merely an example. That is, the first, second, and third connection conductive layers 45, 46, and 47 can be either symmetrical or asymmetrical about the central line, and the inductor element 13 can have a structure that is asymmetrical about the central line, provided that the semiconductor device has a plurality of intersections and both the first and second conductive layers at each intersection are provided in each of the portions from the intermediate point to one of the two end portions of the conductive layers of the thin-film inductor element 13.

Sixth Embodiment

Figure 11:
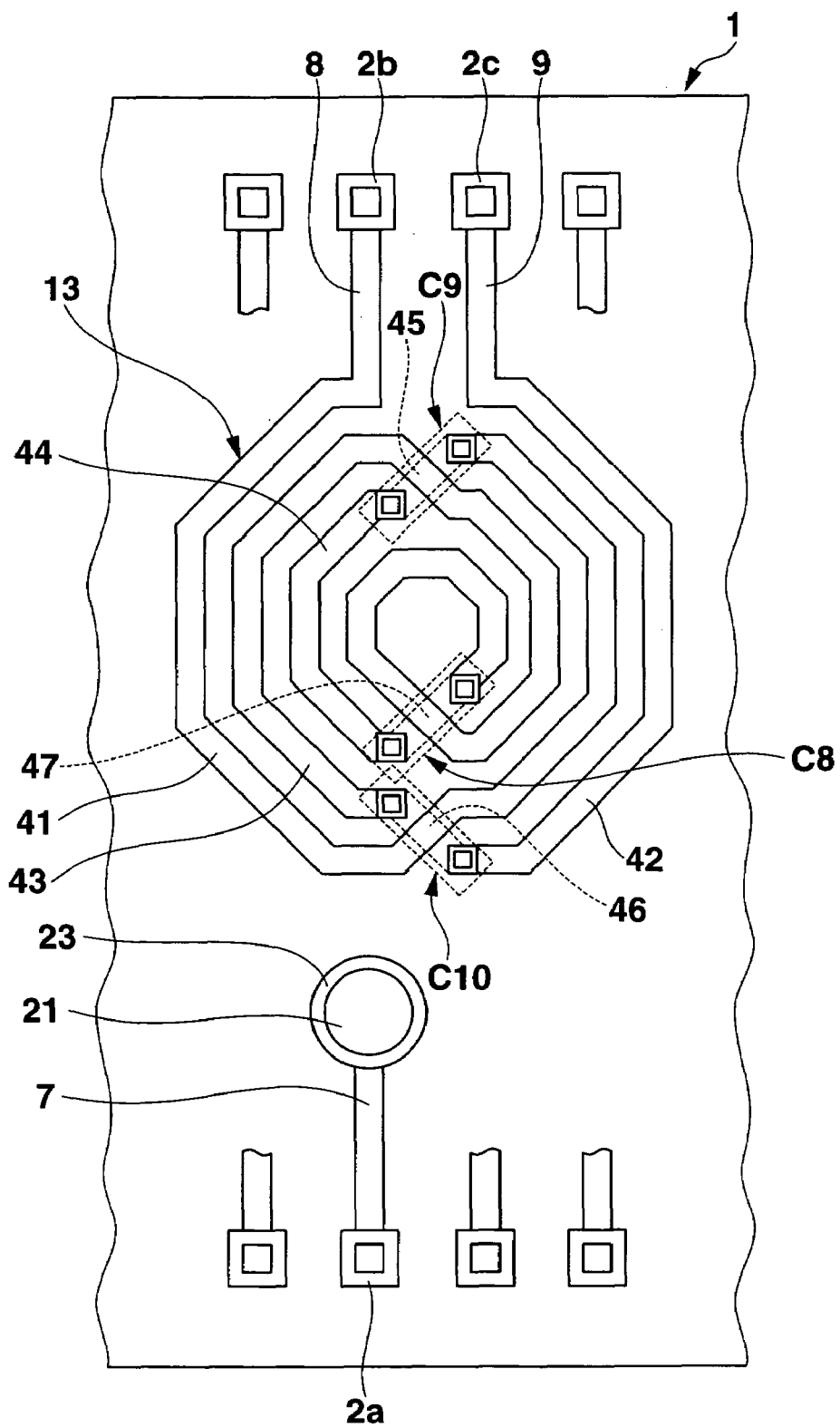
FIG. 11 is a plan view of the major components of a semiconductor device according to the sixth embodiment of the present invention.

FIG. 11 is a plan view of the major components of a semiconductor device according to the sixth embodiment of the present invention.

Like the semiconductor device according to the fifth embodiment, the semiconductor device according to the sixth embodiment includes an inductor formed by four spiral conductive layers and three intersections. The differences between the semiconductor device according to the sixth embodiment and the semiconductor device according to the fifth embodiment are that according to the sixth embodiment, the first inner conductive layer 43 has two spiral turns, and the second inner conductive layer 44 has a semicircular shape. Similarly to the fifth embodiment, according to the sixth embodiment the third connection conductive layer 47 connects the second end portion of the first inner conductive layer 43 and the second end portion of the second inner conductive layer 44.

Figure 12:
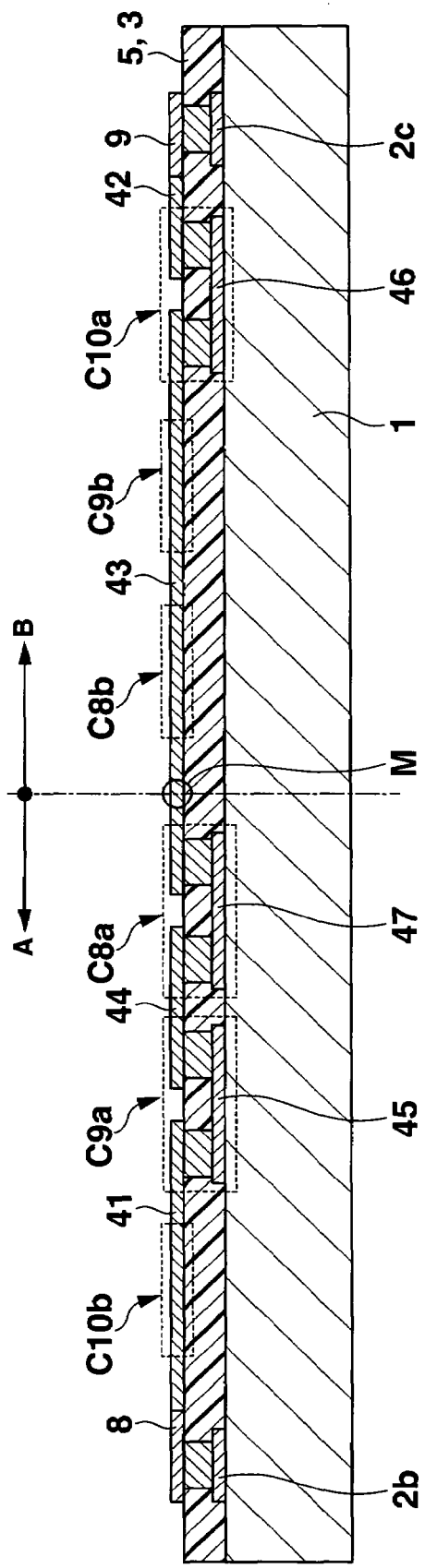
FIG. 12 is a schematic sectional view for explaining the concept of the arrangement of conductive layers in the sixth embodiment.

FIG. 12 is a schematic sectional view similar to FIG. 3 in which the conductive layers between connection pads 2*b* and 2*c* are virtually linearly extended in order to explain the concept of the arrangement of the conductor and conductive layers in the sixth embodiment.

In the structure shown in FIG. 12, a portion of the first inner conductive layer 43 is formed over the third connection conductive layer 47 via the insulating film 3 and protective film 5, thereby forming the first intersection C8 at which the first inner conductive layer 43 and third connection conductive layer 47 intersect each other. A portion of the first inner conductive layer 43 is formed over the first connection conductive layer 45 via the insulating film 3 and protective film 5, thereby forming the second intersection C9 at which the first inner conductive layer 43 and first connection conductive layer 45 intersect each other. And a portion of the first outer conductive layer 41 is formed over the second connection conductive layer 46 via the insulating film 3 and protective film 5, thereby forming the third intersection C10 at which the first outer conductive layer 41 and second connection conductive layer 46 intersect each other.

Reference symbol M in FIG. 12 denotes an intermediate point between the connection pads 2b and 2c along the longitudinal direction of the conductive layers. Reference symbols C8a and C8b in FIG. 12 denote portions corresponding to a first intersection C8 shown in FIG. 11. Portions C8a and C8b actually exist in the same position, and form the first intersection C8 shown in FIG. 11 at which the third connection conductive layer 47 and a portion of the first inner conductive layer 43 intersect each other via the insulating film 3 and the protective film 5. Reference symbols C9a and C9b in FIG. 12 denote portions corresponding to a second intersection C9 shown in FIG. 11. In addition, portions C9a and C9b actually exist in the same position, and form the second intersection C9 shown in FIG. 11 at which the first connection conductive layer 45 and a portion of the first inner conductive layer 43 intersect each other via the insulating film 3 and the protective film 5. Still further, reference symbols C10a and C10b in FIG. 12 denote portions corresponding to a third intersection C10 shown in FIG. 11. Portions C10a and C10b actually exist in the same position, and form the third intersection C10 shown in FIG. 11 at which the second connection conductive layer 46 and a portion of the first outer conductive layer 41 intersect each other via the insulating film 3 and the protective film 5.

With the arrangement of the conductive layers according to this embodiment, a portion of each of the three intersections C8, C9, and C10 is positioned between the intermediate point M and the first end portion (the connection pad 2b) of the conductive layers, and a portion of each of the three intersections C8, C9 and C10 is positioned between the intermediate point M and the second end portion (the connection pad 2c) of the conductive layers.

With this structure, the third connection conductive layer 47 (made of the first conductive layer), which is provided at the first intersection C8, the first connection conductive layer 45 (made of the first conductive layer), which is provided at the second intersection C9, and the first outer conductive layer 41 (made of the second conductive layer), including the portion thereof which is provided at the third intersection C10 are provided along direction A shown in FIG. 12, which extends from the intermediate point M to the first end portion (the connection pad 2b) of the conductive layers. That is, both the first and second conductive layers are present along direction A in FIG. 12. In addition, the portion of the first inner conductive layer 43 (made of the second conductive layer) which is provided at the first intersection C8, the portion of the first inner conductive layer 43 (made of the second conductive layer) which is provided at the second intersection C9, and the second connection conductive layer 46 (made of the first conductive layer) which is provided at the third intersection C10 are provided along direction B shown in FIG. 12, which extends from the intermediate point M to the second end portion (the connection pad 2c) of the conductive layers. That is, both the first and second conductive layers are present along direction B in FIG. 12.

Thus, the third connection conductive layer 47 (made of the first conductive layer), the first connection conductive layer 45 (made of the first conductive layer), and the first outer conductive layer 41 (made of the second conductive layer) are arranged in this order at the first, second, and third intersections C8, C9, and C10 along direction A in the portion of the conductive layers extending from the intermediate point to the first end portion of the conductive layers, and the first inner conductive layer 43 made of the second conductive layer. In addition, the first inner conductive layer 43 (made of the second conductive layer), and the second connection conductive layer 46 (made of the first conductive layer) are arranged in this order at the first, second, and third intersections C8, C9, and C10 along direction B in the portion of the conductive layers extending from the intermediate point M to the section end portion of the conductive layers, such that the first inner conductive layer 43 is provided at the intersections C8 and C9 and the second connection conductive layer 46 is provided at the intersection C10. Accordingly, the arrangement orders of the first and second conductive layers at each intersection are opposite.

As described above, like the semiconductor device shown in FIG. 6, for example, the semiconductor device according to the sixth embodiment has a plurality of portions of conductive layers that form intersections provided between the intermediate point M and each of the two end portions of the conductive layers of the thin-film element 13, such that an equal number of the portions of the conductive layers that form the intersections are provided along direction A (from the intermediate point M to the first end portion) and along direction B (from the intermediate point M to the second end portion). In addition, both the first and second conductive layers are provided along direction A (from the intermediate point M to the first end portion) and along direction B (from the intermediate point M to the second end portion). Accordingly, it is possible to equalize or almost equalize the decreases in Q value caused by the first conductive layer as a lower layer with respect to the inductor characteristics viewed from each of the two end portions, and equalize or almost equalize the characteristics viewed from each of the two end portions of the thin-film inductor element 13.

In particular, according to the sixth embodiment, the first conductive layer as a lower layer is formed at the first intersection C8 and second intersection C9 in direction A from the intermediate point M to the first end portion (the connection pad 2b) of the conductive layers, and the second conductive layer as an upper layer is formed at the first intersection C8 and second intersection C9 in direction B from the intermediate point M to the second end portion (the connection pad 2c) of the conductive layers. As the distance from the terminal of the thin-film inductor element to the lower conductive layer increases, the influence of the decrease in Q value of the inductor characteristics caused by the lower conductive layer decreases. Accordingly, the arrangement according to the sixth embodiment can further reduce the difference between the characteristics viewed from each of the two end portions of the thin-film inductor element 13, compared to the arrangement according to the fifth embodiment described above.

The results of examination of the difference between the Q value viewed from the first end portion (the connection pad 2b) of the thin-film inductor element 13 and the Q value viewed from the second end portion (the connection pad 2c) in each embodiment described above will be briefly explained below.

When the outer dimension of the thin-film inductor element 13 was 1 mm or less (or 700 μm or less) and the line width and line pitch were 10 to a few tens of micrometers, the Q value difference was about 3.7% in the first embodiment shown in FIG. 1 in which the number of turns was two, about 1.8% in the second embodiment shown in FIG. 3 in which the number of turns was two, about 1.8% in the third embodiment shown in FIG. 4 in which the number of turns was two, about 7.7% in the fourth embodiment shown in FIG. 5 in which the number of turns was three, about 8.7% in the fifth embodiment shown in FIG. 6 in which the number of turns was four, and about 4.4% in the sixth embodiment shown in FIG. 7 in which the number of turns was four. As described above, the arrangement of each embodiment of the present invention can reduce the difference between the Q values viewed from each of the two end portions to about 10% or less, i.e., can almost equalize these Q values.

Note that although the embodiments described above explained a spiral thin-film inductor element having two to four turns, the thin-film inductor element can also have a spiral shape with five or more turns.

What is claimed is:

1. A semiconductor device comprising:
   a semiconductor substrate;
   an insulating film formed on the semiconductor substrate; and
   a thin-film inductor element, which is formed on the insulating film, and which includes a first terminal, a second terminal, and a conductive layer formed into a spiral shape between the first terminal and the second terminal so as to have a plurality of turns and at least one intersection,
   wherein the conductive layer includes: (i) a first conductive layer formed on the semiconductor substrate, and (ii) a second conductive layer which is formed on the insulating film, connects to the first terminal and the second terminal, intersects the first conductive layer via the insulating film at the intersection, and is electrically connected to the first conductive layer near the intersection,
   wherein the first conductive layer and the second conductive layer are symmetrically arranged in directions from an intermediate point between the first terminal and the second terminal along a longitudinal direction of the conductive layer to the first terminal and the second terminal, and
   wherein a ratio of a length from the first terminal to a portion of the second conductive layer which electrically connects to the first conductive layer to a length from the second terminal to a portion which electrically connects to the first conductive layer is set at a value by which a difference between a Q value of the thin-film inductor element viewed from the first terminal and a Q value of the thin-film inductor element viewed from the second terminal is not more than 10%.

2. A device according to claim 1, wherein
   the semiconductor substrate comprises a circuit element formation region in which an integrated circuit is formed, and
   the insulating film is formed on the circuit element formation region.

3. A device according to claim 2, wherein the first conductive layer is formed in the circuit element formation region.

4. A device according to claim 1, wherein
   a plurality of connecting terminals for external connection are formed on the semiconductor substrate, and
   each of the first terminal and the second terminal of the thin-film inductor element connects to one of said plurality of connecting terminals.

5. A device according to claim 1, wherein the first conductive layer electrically connects to the second conductive layer through at least one hole formed in the insulating film near the intersection.

6. A device according to claim 1, wherein in the thin-film inductor element, an arrangement order of the first conductive layer and the second conductive layer in a portion from the intermediate point to the first terminal and an arrangement order of the first conductive layer and the second conductive layer in a portion from the intermediate point to the second terminal are the same.

7. A device according to claim 1, wherein the first conductive layer is formed in a position including the intermediate point.

8. A device according to claim 7, wherein the thin-film inductor element has two turns, and wherein the thin-film inductor element comprises:
   an outer conductive layer made of the second conductive layer and formed into a partially cut annular shape, and an inner conductive layer made of the second conductive layer and formed inside the outer conductive layer into an annular shape that is cut on a same side that the annular shape of the outer conductive layer is cut,
   an extraction conductive layer formed from one end portion of the outer conductive layer to the first terminal and an extraction conductive layer formed from one end portion of the inner conductive layer to the second terminal, and
   a connection conductive layer, which: (i) is formed in a position including the intermediate point at the intersection, (ii) is made of the first conductive layer, and (iii) electrically connects to an end portion of the outer conductive layer and an end portion of the inner conductive layer below the insulating film.

9. A device according to claim 8, wherein at the intersection, the inner conductive layer is formed above the connection conductive layer via the insulating film.

10. A device according to claim 8, wherein at the intersection, the extraction conductive layer is formed above the connection conductive layer via the insulating film.

11. A device according to claim 1, wherein the thin-film inductor element has two turns, and the thin-film inductor element comprises:
    a semicircular first outer conductive layer and a semicircular second outer conductive layer made of the second conductive layer,
    an inner conductive layer formed into a partially cut annular shape inside the first outer conductive layer and the second outer conductive layer,
    an extraction conductive layer formed from a first end portion of the first outer conductive layer and a first end portion of the second outer conductive layer to the first terminal and the second terminal, respectively,
    a first connection conductive layer which: (i) is formed at the intersection, (ii) is made of the first conductive layer, and (iii) is electrically connected to a first end portion of the inner conductive layer and a second end portion of the first outer conductive layer below the insulating film, and
    a second connection conductive layer which is made of the first conductive layer, and which is electrically connected to a second end portion of the inner conductive layer and a second end portion of the second outer conductive layer below the insulating film.

12. A device according to claim 11, wherein at the intersection, the second outer conductive layer is formed above the first connection conductive layer via the insulating film.

13. A semiconductor device comprising:
    a semiconductor substrate;
    an insulating film formed on the semiconductor substrate; and
    a thin-film inductor element, which is formed on the insulating film, and which includes a first terminal, a second terminal, and a conductive layer formed into a spiral shape between the first terminal and the second terminal so as to have a plurality of turns and a plurality of intersections, wherein the conductive layer includes: (i) a first conductive layer formed on the semiconductor substrate, and (ii) a second conductive layer which is formed on the insulating film, connects to the first terminal and the second terminal, intersects the first conductive layer via the insulating film at each of the intersections, and is electrically connected to the first conductive layer near each intersection, and wherein two consecutive intersections along a longitudinal direction of the thin-film inductor element from the first terminal and two consecutive intersections from the second terminal of the conductive layer include a first intersection at which the conductive layer is made of the first conductive layer and a second intersection at which the conductive layer is made of the second conductive layer.

14. A device according to claim 13, wherein
the semiconductor substrate comprises a circuit element formation region in which an integrated circuit is formed, and
the insulating film is formed on the circuit element formation region.

15. A device according to claim 14, wherein the first conductive layer is formed in the circuit element formation region.

16. A device according to claim 13, wherein
a plurality of connecting terminals for external connection are formed on the semiconductor substrate, and
each of the first terminal and the second terminal of the thin-film inductor element connects to one of said plurality of connecting terminals.

17. A device according to claim 13, wherein the first conductive layer electrically connects to the second conductive layer through at least one hole formed in the insulating film near the intersection.

18. A device according to claim 13, wherein the conductive layer has equal numbers of intersections in a portion from an intermediate point between the first terminal and the second terminal along a longitudinal direction of the conductive layer to the first terminal, and in a portion from the intermediate point to the second terminal along the longitudinal direction of the conductive layer to the second terminal.

19. A device according to claim 13, wherein an arrangement order of the first conductive layer and the second conductive layer forming the conductive layer at each of said plurality of intersections in a portion from an intermediate point between the first terminal and the second terminal along a longitudinal direction of the conductive layer to the first terminal is opposite to an arrangement order of the first conductive layer and the second conductive layer forming the conductive layer at each of said plurality of intersections in a portion along the longitudinal direction from the intermediate point to the second terminal.

20. A device according to claim 13, wherein an arrangement order of the first conductive layer and the second conductive layer in a portion from an intermediate point between the first terminal and the second terminal along a longitudinal direction of the conductive layer to the first terminal is the same as an arrangement order of the first conductive layer and the second conductive layer in a portion along the longitudinal direction from the intermediate point to the second terminal.

21. A device according to claim 13, wherein the thin-film inductor element has three turns and two intersections, and
wherein the first conductive layer and the second conductive layer forming the conductive layer are alternately formed at each of the two intersections in a portion from an intermediate point between the first terminal and the second terminal along a longitudinal direction of the conductive layer to the first terminal, and at each of the two intersections in a portion from the intermediate point to the second terminal along the longitudinal direction.

22. A device according to claim 13, wherein the thin-film inductor element has four turns and three intersections, and
wherein the first conductive layer and the second conductive layer forming the conductive layer are alternately formed at each of the three intersections in a portion from an intermediate point between the first terminal and the second terminal along a longitudinal direction of the conductive layer to the first terminal, and at each of the three intersections in a portion from the intermediate point to the second terminal along the longitudinal direction.

23. A device according to claim 13, wherein the thin-film inductor element has four turns and three intersections,
wherein the first conductive layer forming the conductive layer is continuously formed at two consecutive intersections of the three intersections in a portion from an intermediate point between the first terminal and the second terminal along a longitudinal direction of the conductive layer to the first terminal, and
wherein the second conductive layer forming the conductive layer is continuously formed at two consecutive intersections of the three intersections in a portion from the intermediate point to the second terminal along the longitudinal direction.

24. A semiconductor device comprising:
a semiconductor substrate;
an insulating film formed on the semiconductor substrate; and
a thin-film inductor element, which is formed on the insulating film, and which includes a first terminal, a second terminal, and a conductive layer formed into a spiral shape between the first terminal and the second terminal so as to have two turns and one intersection,
wherein the conductive layer includes: (i) a first conductive layer formed on the semiconductor substrate, and (ii) a second conductive layer which is formed on the insulating film, connects to the first terminal and the second terminal, intersects the first conductive layer via the insulating film at the intersection, and is electrically connected to the first conductive layer near the intersection, and
wherein the thin-film inductor element comprises:
a semicircular first outer conductive layer and a semicircular second outer conductive layer made of the second conductive layer,
an inner conductive layer formed into a partially cut annular shape inside the first outer conductive layer and the second outer conductive layer,
an extraction conductive layer formed from a first end portion of the first outer conductive layer and a first end portion of the second outer conductive layer to the first terminal and the second terminal, respectively,
a first connection conductive layer which: (i) is formed at the intersection, (ii) is made of the first conductive layer, and (iii) is electrically connected to a first end portion of the inner conductive layer and a second end portion of the first outer conductive layer below the insulating film, and a second connection conductive layer which is made of the first conductive layer, and which is electrically connected to a second end portion of the inner conductive layer and a second end portion of the second outer conductive layer below the insulating film.

* * * * *